United States Patent [19]
Puech et al.

[11] 4,370,612
[45] Jan. 25, 1983

[54] INTERFEROMETRIC OPTICAL FIBER ELECTRIC CURRENT MEASURING DEVICE

[75] Inventors: Claude Puech; Hervé Arditty; Michel Papuchon, all of Paris, France

[73] Assignee: Thomson-CSF, Paris, France

[21] Appl. No.: 171,285

[22] Filed: Jul. 23, 1980

[30] Foreign Application Priority Data

Jul. 24, 1979 [FR] France ................................ 79 19078

[51] Int. Cl.³ ............................................ G01R 19/00
[52] U.S. Cl. ................................... 324/117 R; 324/96
[58] Field of Search ............. 324/117 R, 96; 350/356; 332/7.51

[56] References Cited

U.S. PATENT DOCUMENTS 4,070,622  1/1978  Harms et al. .......................... 324/96
4,299,490  11/1981  Cahill et al. .......................... 356/350

Primary Examiner—Ernest F. Karlsen
Attorney, Agent, or Firm—Oblon, Fisher, Spivak, McClelland & Maier

[57] ABSTRACT

The current-measuring device in accordance with the invention comprises an optical fiber wound around the conductor in which flows the current to be measured, a laser source, means for separating the radiation emitted by the source towards the two ends of the wound fiber, and for recombining the radiation emerging from these two ends, a conductor circuit through which flows an adjustable reference current, a detection device supplying a signal characteristic of the interferences between the two waves emerging from the fiber, the reference current being adjusted so that the phase shift between the two contra-rotating waves in the fiber is zero, this current being then proportional to the current to be measured flowing in the principal conductor.

10 Claims, 8 Drawing Figures

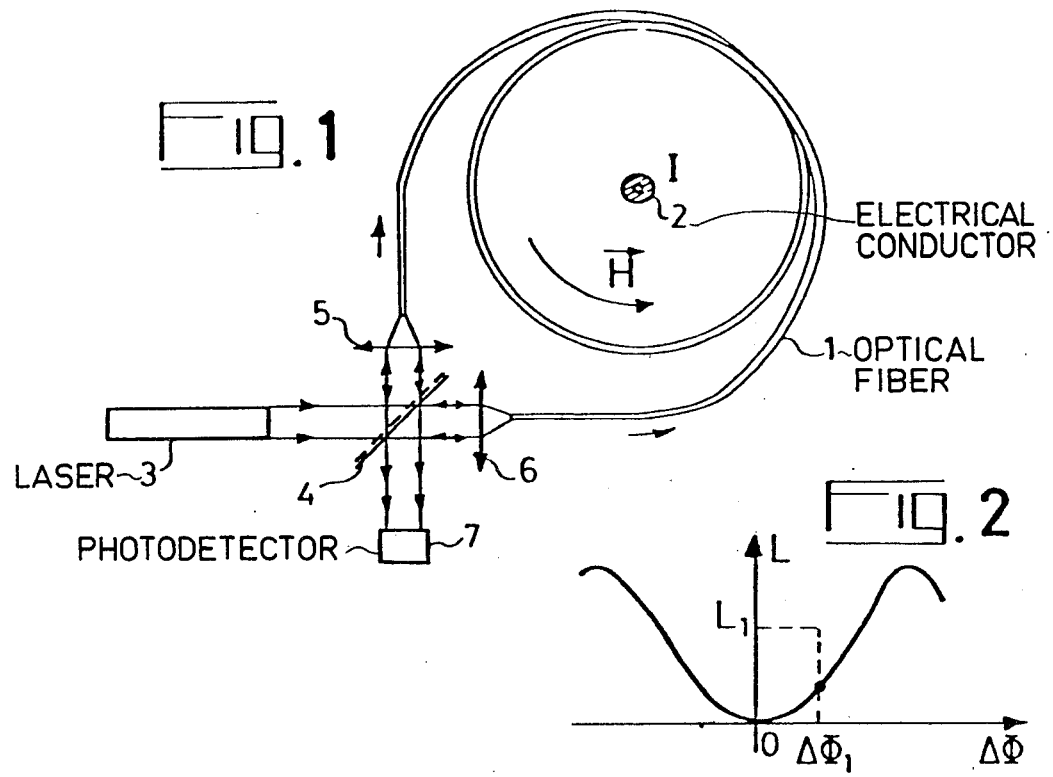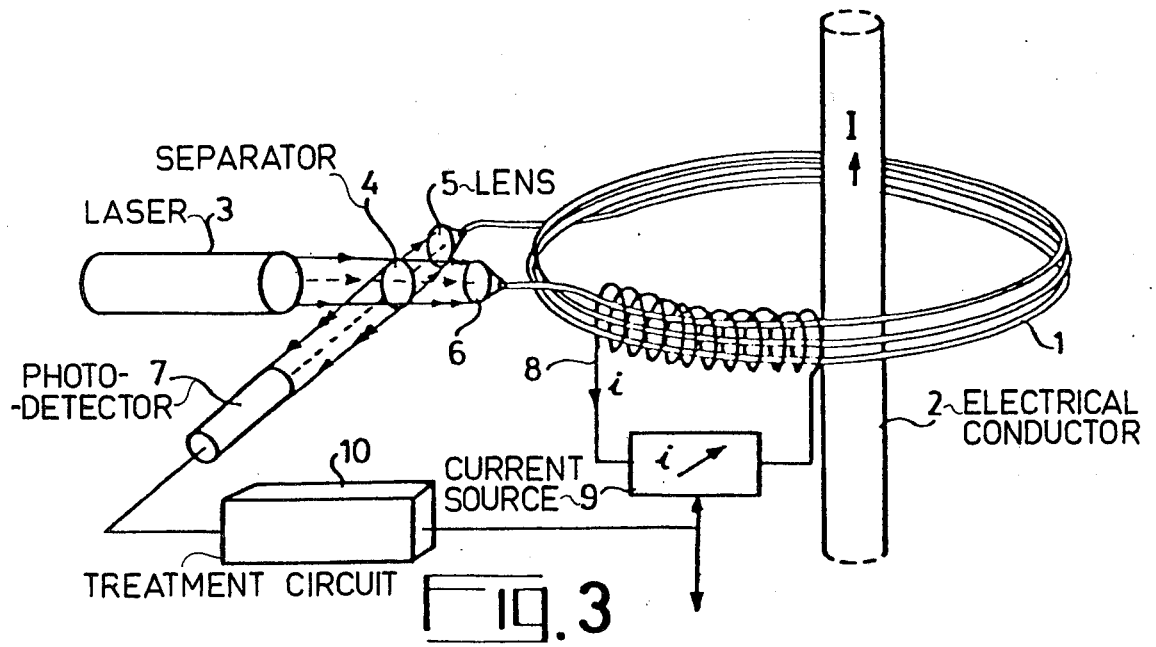

INTERFEROMETRIC OPTICAL FIBER ELECTRIC CURRENT MEASURING DEVICE

BACKGROUND OF THE INVENTION

The invention relates to the field of electric current measurement and concerns more particularly a device for measuring such currents having a wide measuring range and capable of suitably operating in a difficult environment.

The measurement of DC currents of high strength is difficult with the usual measuring devices, in some environments, particularly in electric power stations or electrochemical factories. In fact, in such environments, the high voltages, the high temperatures, the possibly corrosive atmosphere, the electromagnetic pollution or quite simply the difficulty of access make measurements difficult and unreliable when they are carried out by conventional means such as the shunt or Hall-effect gauge type, for example. Thus, in order to measure currents of the order of about a hundred thousand amps, current-measuring devices of the shunt type only allow accuracy of the order of 10% of the measured value to be obtained. Furthermore, such devices cause energy losses in the measuring device.

SUMMARY OF THE INVENTION

The invention provides an accurate and very sensitive electric current measuring device having a large range of measurement which, when the environment is difficult, may be disposed so that the measuring part of the device is situated in a place which is possibly protected, the sensor part alone being placed in the environment and being insensitive to the conditions imposed by this environment. Furthermore, this measuring device is without contact with the principal circuit in which flows the current to be measured, which avoids losses in the principal circuit due to the measuring device. This measuring device has then excellent electrical decoupling.

In accordance with the invention the optical-fiber interferometer device for measuring electric current comprising a wound optical fiber forming at least one turn about the conductor in which flows the current I to be measured, is principally characterized in that the two ends of this optical fiber are coupled to a light source by means of an optical device comprising means for separating the beam coming from the source into two waves intended to flow in the fiber in opposite directions, the optical device also comprising means for recombining the waves emerging from the fiber and a device for detecting the radiation resulting from the recombination, the signal coming from the detection device being tied to the phase shift $\Delta\phi_1$ between the two waves circulating in opposite directions induced in the fiber by the Faraday effect due to the current I to be measured, the measuring device comprising furthermore a signal processing device coupled to the detector providing a current measurement.

DESCRIPTION OF THE DRAWINGS

The invention will be better understood and other characteristics will appear from the following description with reference to the accompanying figures.

FIG. 1 shows a first embodiment of the current-measuring device in accordance with the invention.

FIG. 2 is a curve showing the light intensity variations on the detector depending on the phase shift induced, in the optical fiber, by the electric conductor.

FIG. 3 shows a second embodiment of the measuring device in accordance with the invention using a zero method.

DESCRIPTION OF THE PREFERRED EMBODIMENTS

Figure 5:
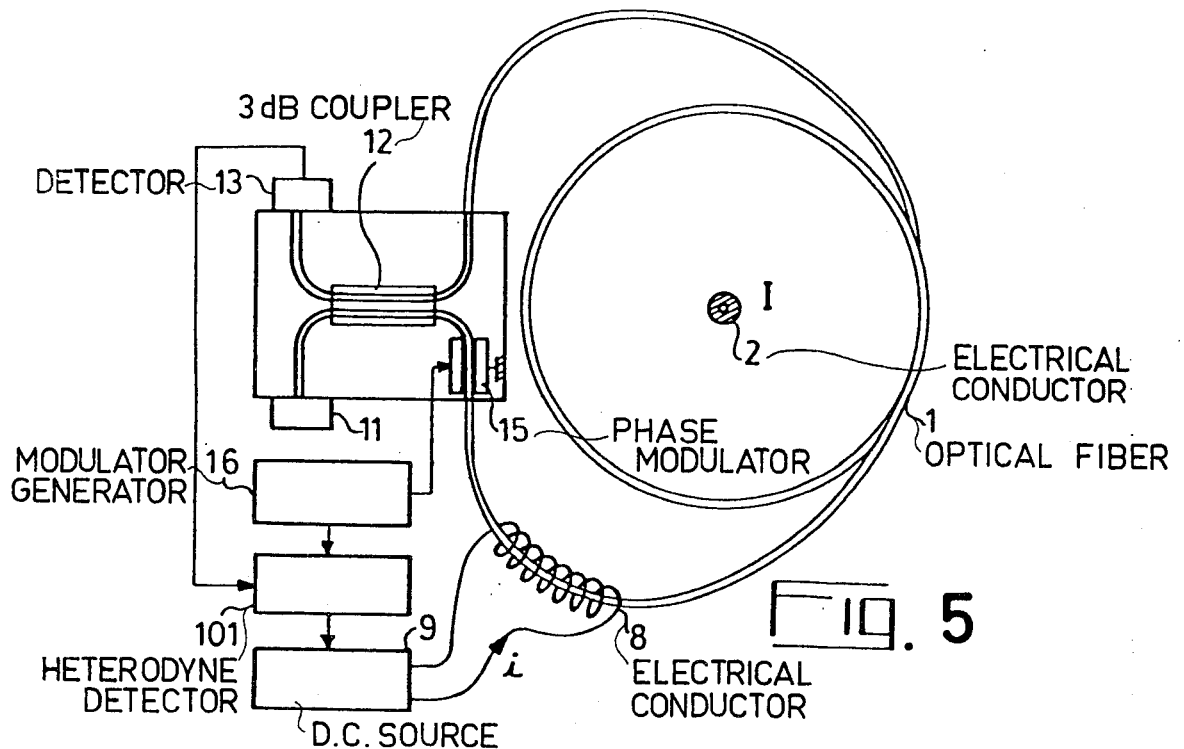
FIG. 5 shows another embodiment of the device of the invention, partially constructed with integrated optics, in which the optical wave is assigned a modulated phase shift.

In all these figures, the same elements have been designated by the same references.

The current flowing in a conductor induces a magnetic field around this conductor. If a light wave is propagated in a medium surrounding this conductor, the magnetic field induces, by a magneto-optical effect, variations in the propagation conditions of the light wave. When the magnetic field and the direction of propagation of the light wave are parallel, the magneto-optical effect induced on the light wave is a nonreciprocal effect, Faraday effect, depending on the direction of propagation of the wave with respect to the direction of the magnetic field.

In order to reveal by this non-reciprocal effect a measurable quantity which is directly tied to the current flowing in the conductor and which, consequently, does not integrate other effects and in particular the reciprocal effects which also produce variations in the propagation conditions (temperature variation or pressure variation for example), the device of the invention uses two waves contra-rotating in the same propagation medium surrounding the conductor; these two waves undergo in the same way the reciprocal effects inducing in the medium variations in the propagation conditions varying in the same direction, and undergo by a nonreciprocal Faraday effect variations in opposite directions. These opposite-direction variations can be detected by an interferometric method.

In order to accomplish this, the current-measuring device of the invention comprises an optical fiber wound around the conductor in which the current I to be measured flows, this optical fiber comprising one or more turns, the two ends of this wound optical fiber each receiving an optical wave coming for example from a laser; these two waves flow in opposite directions in the fiber. The current flowing in the conductor induces a magnetic field in the same direction as the direction of propagation of one of the waves, and in a direction opposite that of the other. The two waves emerging from the fiber present a phase shift $\Delta\phi$ which depends on the Verdet constant characteristic of the Faraday effect of the propagation medium, on the strength I of the current flowing in the conductor (possibly of the number N of conductors when the optical fiber surrounds several conductor branches in which the same current I flows), and on the number M of turns of the optical fiber surrounding the conductor.

To reveal the phase shift between the two waves, the measuring device of the invention uses an interferometer structure, the two contrarotating waves emerging from the ends of the fiber being recombined and the corresponding signal being detected by a photodetector.

Taking into account the different constants occuring in the device, and the variations in time likely to be produced, it is very difficult to know the scale factor of such a measuring device, i.e. the relationship connecting the strength I of the current flowing in the conductor and the light strength L detected by the photodetector. Accordingly, in the preferred embodiments of the invention, the measuring device uses a zero method for effecting this measurement. For that, the optical fiber and so the optical wave undergo the effects of a reference magnetic field produced by a current i very much less than the current to be measured flowing through a conductor passing a large number of times through the optical-fiber loop. Current i is adjustable and adjusted at all times to compensate for the phase shift $\Delta\phi$ induced by the current I while creating a phase shift $-\Delta\phi$ induced by current i.

The explanations given above enable the different embodiments of the current-measuring device described hereafter with reference to the accompanying drawings to be better understood.

FIG. 1 shows the simplest method of constructing the current-measuring device of the invention. It comprises a monomode or multimode optical fiber 1 wound about the conductor 2 in which flows the current I to be measured.

This fiber forms one or more turns about the conductor, depending on the current range to be measured. A light beam from a laser 3 is coupled simultaneously to both ends of fiber 1 through an optical separation and coupling circuit comprising a beam-separator 4 and lenses 5 and 6 focusing the radiation which passes therethrough onto the faces of the ends of the fiber. The two light waves flow in the fiber in opposite directions, emerge from both ends and pass respectively through lenses 6 and 5 to be recombined after, respectively, reflection and transmission by beam-separator 4. The radiation resulting from the mixture of emerging waves is detected by a photodetector 7. When conductor 2 has passing therethrough a current I, it induces a magnetic field $\vec{H}$ along closed lines around this conductor. The light wave which is propagated in the fiber undergoes, on circular polarization components, a phase shift induced by Faraday effect by the magnetic field. It is known that an optical fiber behaves like a stack of birefringent plates inducing on the light wave which is propagated polarization variations. These effects are reciprocal and act on the two contra-rotating waves in the same way; on the other hand, the magnetic rotary polarization effect acting only on the waves of circular polarization to introduce an advance or a delay on each of the components, acts in different directions on the two contra-rotating waves and so introduces therebetween an overall phase shift $\Delta\phi$. In fact, for each wave the establishment of the magnetic field parallel to the direction of propagation advances the circular vibration in the same direction as the magnetizing current and delays by an equal amount the circular vibration in the opposite direction. Even if the state of polarization of the light wave varies during its propagation along the fiber, the advance and delay effects are cumulated along this fiber and the two emerging waves present a phase shift capable of being detected by interferometry representing directly the effects induced by the current I flowing in the conductor, the other effects being undergone in an identical way by the two waves and so not introducing therebetween any phase shift.

The measuring device shown supplies at the detector a light intensity L which varies depending on the phase shift $\Delta\phi$ between the two contra-rotating waves in accordance with the curve shown in FIG. 2, the phase shift $\Delta\phi$ depending on the current I flowing in the conductor. But, because of the variation undergone by the waves in the fiber with respect to time, the scale factor of this curve is not fixed in time, i.e. that the light intensity $L_1$ detected for a fixed induced phase shift $\Delta\phi_1$, due to a given current $I_1$, may vary with respect to time. This measuring device does not then allow an absolute measurement of current I to be supplied.

The measuring device shown in FIG. 3 uses a zero method making available at all times an adjusted reference value i to produce a phase shift between the two contra-rotating waves by Faraday effect counterbalancing exactly the phase shift introduced by the current I to be measured, this current i being then directly proportional to the current I to be measured. The measuring device shown in this figure comprises, like the one shown in FIG. 1, an optical fiber 1 comprising M turns wound around the conductor 2 in which flows the current I to be measured. This fiber is fed with two optical waves in the same way as that shown in FIG. 1. The device comprises furthermore a conductor 8 comprising m turns surrounding one (or more) turns of the wound optical fiber 1. This conductor 8 has flowing therethrough a variable currrent i delivered by a current generator 9. The signal from photodetector 7 corresponding to the interferences between the two contra-rotating waves emerging from the fiber, is transmitted to a processing device 10 which supplies to the current generator 9 a control signal such that at all times the phase shift between the two contra-rotating waves is zero.

If K is the Verdet constant of the material forming the fiber, M the number of turns wound around conductor 2, N the number of branches of conductor 2 surrounded by this wound fiber 1, the phase shift $\Delta\phi_1$ induced by the current I flowing in conductor 2 is:

$$\Delta\phi_1 = K\,M\,N\,I.$$

If n is the number of turns of conductor 8 surrounding m turns of the optical fiber 1, the phase shift $\Delta\phi_2$ induced by the current i flowing in conductor 8 is:

$$\Delta\phi_2 = K\,m\,n\,i.$$

The processing circuit 10 applies to the current generator a control signal such that at all times $\Delta\phi_1 = -\Delta\phi_2$, the phase shift between the two contra-rotating waves being thus maintained equal to zero at all times. The value of current I is then deduced from the value of current i by the relationship $I = (m\,n/M\,N)\cdot i$.

Figure 4:
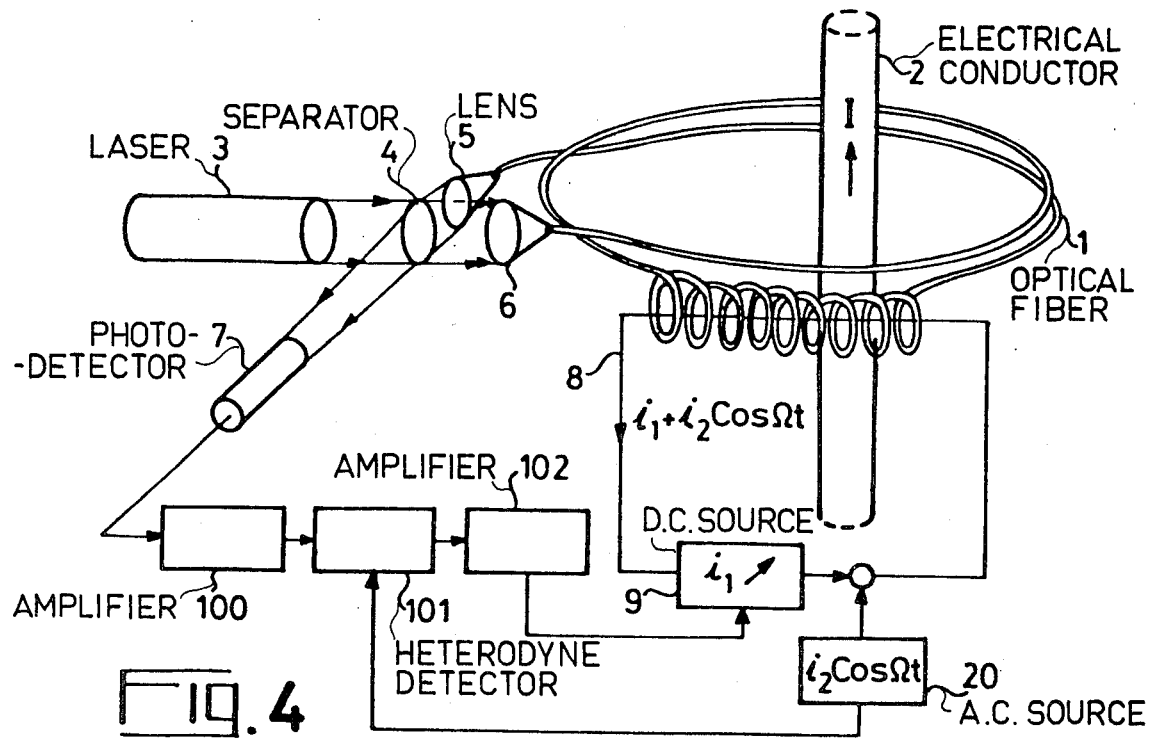
FIG. 4 shows a third embodiment of the measuring device of the invention in which the reference current is modulated.

In FIG. 3, M=3, N=1, m=10 and n=3. This measuring device in which the measurement is carried out by a null method, with pilot control of current i, allows a measurement to be obtained with a resolution of the order of $10^{-3}$ of full scale, the current I thus measurable being able to vary in frequency between a direct current and an alternating current of a few MHz, the upper limit of the band being determined by the frequency limit of the detector. To obtain a measuring device having greater resolution, several methods may be considered. The first consists in modulating the current flowing in reference conductor 8 and in then carrying out heterodyne detection at the modulation frequency of this current, the signal from this heterodyne detection allowing the DC component of the current flowing in conductor 8 to be monitored. FIG. 4 shows such an embodiment. The optical system is not modified with respect to the one shown in FIG. 3, on the other hand the optical fiber was shown as comprising two turns surrounding the conductor in which flows current I, one of these turns being itself wound around conductor 8. The current flowing in this conductor comprises a DC component $i_1$ provided by the current generator G and an AC component $i_2$ supplied by an AC current generator 20. The phase shift between the two contra-rotating waves flowing in the fiber has then, under these conditions, a DC component and a component varying at the angular frequency $\Omega$. Photodetector 7 delivers then a light intensity varying at the angular frequency $\Omega$. The signal from photodetector 7 is applied to an amplifying circuit 100, the output signal from this amplifier being applied to a heterodyne detector 101 receiving a signal synchronous with the modulation signal supplied by generator 20. This detector 101 supplies to an amplifying circuit 102 a signal for controlling the DC component of current $i_1$ so that the phase shift between the two contra-rotating waves revealed by the interferences detected by the photodetector is a zero DC component. The measuring rate of this device is considerably greater than that of the device described with reference to FIG. 3. The accuracy may be $10^{-5}$ times the greatest measurable value. The passband of such a device is between a DC current and alternating currents at a few KHz, this limitation being imposed by the current coil 8. In this device, the value of current I is deduced directly from the value of the controlled current $i_1$.

FIG. 5 shows another embodiment of the current-measuring device in accordance with the invention. This device comprises for the optical part an integrated optical circuit fed by means of a semiconductor laser source 11 directly coupled by the edge to the integrated circuit wafer. A 3 dB coupler 12 separates the light beam from laser source 11 between two integrated-optics guide branches, these two branches being respectively coupled to the two ends of the wound optical fiber 1. The device comprises further for detecting the waves emerging after flowing in opposite directions a detector 13 detecting the radiation resulting from the superimposition of the two waves by coupler 12. The output signal from this detector is applied as before to a processing device 10 supplying to current generator 9 a control signal for varying the current i flowing in conductor 8 surrounding the optical fiber. With the aim of increasing the resolution of the measuring device, it is possible, instead of modulating the current i flowing in the reference conductor, to modulate the phase of optical wave. For that, the integrated optical structure is particularly adapted for it is possible to construct in a simple way a phase modulator placed in the integrated optical circuit on one of the two wave guides disposed at the output of the 3 dB coupler. This phase modulator 15 has been shown schematically in FIG. 5. As before, but for different reasons, the phase shift between the two waves emerging from the two ends of the fiber is modulated at the angular fredquency $\Omega$ by means of a modulation-signal generator 16. The processing circuit will then comprise in such a case a heterodyne detector 101 receiving a reference signal at frequency $\Omega$ supplying the current generator 9 with a control signal. This measuring device, when the phase is modulated, allows a passband to be obtained which is a little larger than that able to be obtained when current i is directly modulated. This passband may extend up to a few MHz. It would also be possible for detecting to use reciprocal modulation detection, by using the same integrated electro-optical phase modulator controlled by a modulation signal having a period equal to twice the time taken by the optical wave to travel through the fiber. In fact, when the phase difference between the two contra-rotating waves due to the Faraday effect is zero, and when only a phase difference due to the modulation exists, the detected signal comprises a component at twice the frequency of the modulation frequency. The detection of this double-frequency component which only exists when $\Delta\phi=0$ allows then the value of the reference current i to be determined without ambiguity for which the Faraday effect induced by the current I is exactly counterbalanced. In a discrete-element device, it is also possible to modulate the phase of the wave propagated in the fiber loop in a reciprocal way. For that a phase modulator, which may be formed by winding a few turns of fiber around a piezoelectric ceramic, whose modulation period is equal to twice the travel time in the fiber loop, enables the current i to be obtained, canceling out the Faraday effect, by detection of the double frequency component.

Figure 6:
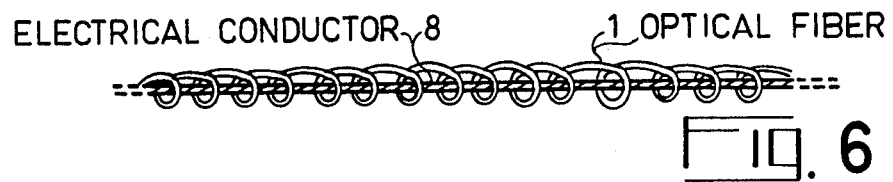
FIGS. 6 and 7 show two embodiments of sensors capable of being used in the zero-method measuring devices of the invention, also usable as elements for connecting to the measuring part of the device.

In the current-measuring devices using a zero method, the above description shows that the sensor is principally formed from an optical fiber and a conductor suitably disposed with respect to each other so that, when the optical fiber surrounds the principal conductor in which the current I to be measured flows, conductor 8 induces in the same optical fiber a phase variation which offsets exactly that which is induced by the current I. This sensor element formed at one and the same time by an optical fiber and by a conductor may be constructed in a simple way. Two embodiments are shown respectively in FIGS. 6 and 7. The embodiment of the sensor element shown in FIG. 6 comprises a metal core forming conductor 8 surrounded by a wound optical fiber. This element may be available in great lengths, the transformation ratio determined by the number of fiber turns surrounding a given length of metal cable being determined in advance. Depending on the range of current I to be measured, the conductor 2 in which this current I flows will be surrounded by one or more turns of the sensor component formed by fiber 1 and the metal core forming conductor 8.

Figure 7:
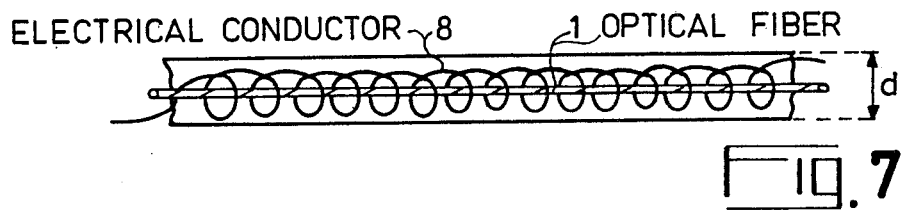
Figure 8:
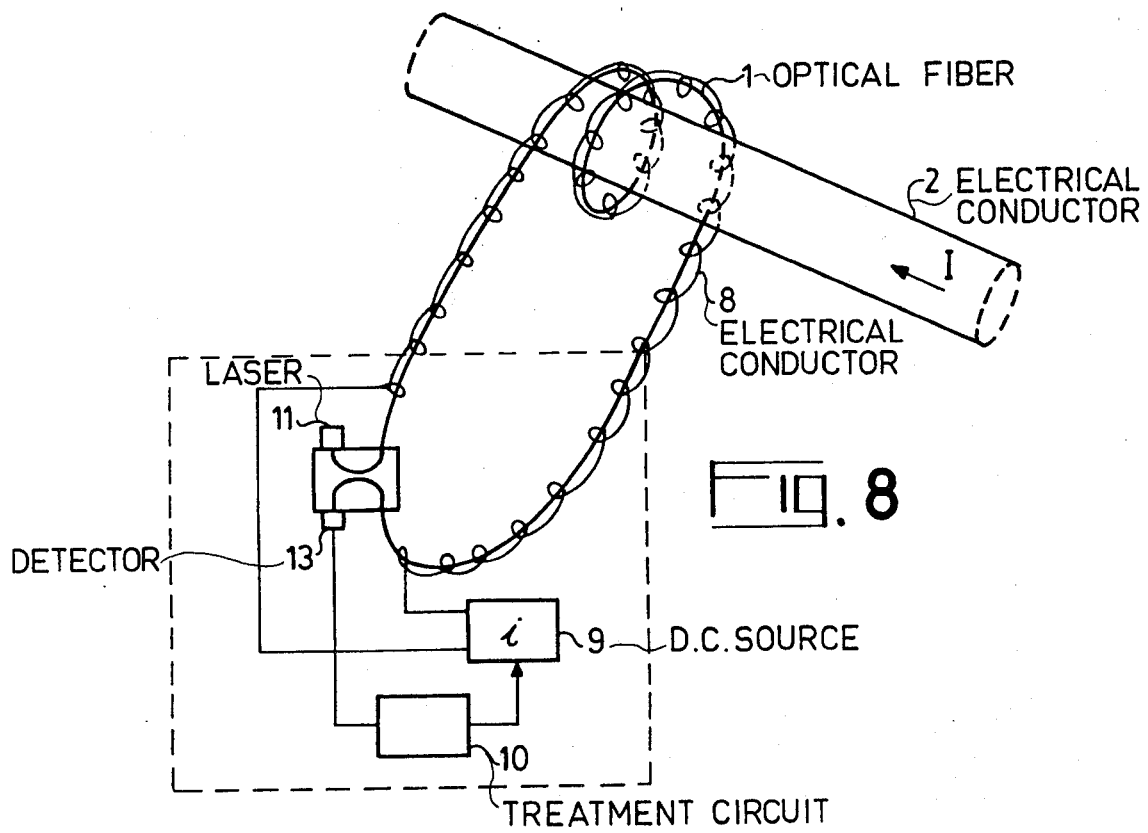
FIG. 8 shows schematically the possible dissociation, in a layout, between the sensor part and the measuring part of the device.

An equivalent embodiment is shown in FIG. 7, in this case, the core of the sensor element is formed by the optical fiber 1, conductor 8 surrounding this optical fiber. The diameter of this sensor element may be of the order of 1 mm. As before, depending on the range of current to be measured, this sensor element will surround conductor 2 while forming one or more turns, the transformation ratio being predetermined from the number of turns of conductor 8 per unit length of the optical fiber 1. FIG. 8 indicates schematically how it is possible, in a lay-out, to dissociate the sensor part and the measuring part of the current-measuring device, the sensor part also serving as a connection between conductor 2 and the measuring part of the device. In this figure, the relative disposition of the fiber and the conductor shown in FIG. 7 has been taken up again, but this disposition is not limitative. The distance separating the conductor 2 in which flows the current I to be measured and the measuring part of the device may be several meters, which allows this measuring part to be moved away from an enviornment in which the conditions may be very difficult.

The current-measuring device according to any one of the embodiments described allows currents of several hundreds of thousands of amps to be measured, i.e. the highest currents used at present, with a very great accuracy. This device may also enable small currents, of the order of milliamps, to be measured.

The invention is not limited to the embodiments precisely described and shown. In particular, the optical fiber 1 in which the two contra-rotating waves flow and conductors 2 and 8 in which flow respectively the current I to be measured and the reference current i, may be disposed in any suitable way. It is also possible with this device to measure the current density in an electrolytic tank by plunging a fiber loop into the tank; with the surface of this loop known, the current density integrated on this surface is equal to the flow of the magnetic field induced by the current about this surface. This magnetic field induces, in the same way as before, a phase shift between the two waves flowing in opposite directions in the fiber by Faraday effect.

Furthermore, it is also possible to measure a current imbalance between the different conductors of a multiphase line, the optical fiber surrounding in this case several conductors in which different currents flow.

Finally, the signal-processing circuits have been described and shown schematically; they may be completed, if need be, to obtain a measurement with greater accuracy.

What is claimed is:

1. An interferometric optical-fiber device for measuring electrical currents comprising a wound optical fiber forming at least one turn about the conductor in which flows the current I to be measured, the two ends of said optical fiber being coupled to a light source by means of an optical device comprising means for separating the beam from the source into two waves intended to flow in the fiber in opposite directions, said optical device comprising also means for recombining the waves emerging from the fiber and a device for detecting the radiation resulting from the recombination, the signal from said detection device being related to the phase shift $\Delta\phi_1$ between the two waves flowing in opposite directions, this phase shift being induced by the current I by Faraday effect in the fiber, said measuring device comprising furthermore a signal-processing device coupled to the detector supplying a current measurement.

2. A device as claimed in claim 1, wherein there is further provided a reference conductor circuit suitably disposed with respect to said optical fiber, this conductor circuit being fed by an adjustable reference current generator so as to induce by Faraday effect due to the reference current i a phase shift $\Delta\phi_2$, the processing device delivering to the adjustable generator a control signal for maintaining at zero the phase shift $\Delta\phi$ between the two waves resulting from the superimposition of the phase shifts $\Delta\phi_1$ and $\Delta\phi_2$.

3. A device as claimed in claim 2, wherein said reference conductor circuit forms several turns around at least one optical fiber branch.

4. A device as claimed in claim 2, wherein said optical fiber forms several turns around at least one branch of said reference conductor circuit.

5. A device as claimed in any one of claims 1, 2, 3 or 4 wherein said optical device comprising the separation and recombination means is constructed on an integrated optical circuit to which are coupled said light source, the two ends of said fiber and said detection device.

6. A device as claimed in claim 2, wherein said reference conductor circuit is also fed by means of an alternating-current generator adding to the adjustable reference current an alternating component, the processing device comprising a heterodyne detector for receiving a signal from said detection device and a signal synchronous with said alternating component, the output signal of said heterodyne detector supplying the control signal to said adjustable reference current generator.

7. A device as claimed in claim 2, wherein there is further provided a phase modulator acting on the phase of the optical waves flowing in the fiber so as to modulate this phase at a given frequency, the processing device comprising a heterodyne detector for receiving the signal from said detection device and a signal synchronous with the control signal of said phase modulator, the output signal from said heterodyne device being the control signal for said reference current generator.

8. A device as claimed in claim 2, wherein there is further provided a phase modulator acting on the optical waves, controlled by a modulation signal having a period double the traveling time of the light in the wound fiber, the processing device comprising a device for detecting the signal at the frequency double that of the modulation signal delivering an output signal when the phase shift $\Delta\phi$ is zero.

9. A device as claimed in claim 7, wherein said optical device is constructed in accordance with integrated optics, said phase modulator being constructed in accordance with integrated optics on the same circuit.

10. A device as claimed in claim 7, wherein said phase modulator comprises a piezoelectric ceramic around which is wound a given length of optical fiber.

* * * * *